United States Patent [19] [11] 4,227,110
Douglas et al. [45] Oct. 7, 1980

[54] TRANSDUCER CONTROL SYSTEM

[75] Inventors: George R. Douglas, Arnold; John H. Thompson, Severna Park, both of Md.

[73] Assignee: Westinghouse Electric Corp., Pittsburgh, Pa.

[21] Appl. No.: 740,683

[22] Filed: Nov. 10, 1976

[51] Int. Cl.[2] .......... H01L 41/10
[52] U.S. Cl. .......... 310/316; 310/325
[58] Field of Search .......... 310/316

[56] References Cited

U.S. PATENT DOCUMENTS

| | | | |
|---|---|---|---|
| 3,293,456 | 12/1966 | Shoh | 310/316 |
| 3,443,130 | 5/1969 | Shoh | 310/316 |
| 3,489,930 | 1/1970 | Shoh | 310/316 |
| 3,668,486 | 6/1972 | Silver | 310/316 X |
| 3,813,616 | 5/1974 | Antonevich | 310/316 X |
| 3,819,961 | 6/1974 | Bourgeois et al. | 310/316 |
| 3,842,340 | 10/1974 | Brandquist | 310/316 X |
| 3,843,897 | 10/1974 | Mishiro | 310/316 |

*Primary Examiner*—Mark O. Budd
*Attorney, Agent, or Firm*—D. Schron

[57] ABSTRACT

A control system for a Tonpilz transducer which is positioned between the transducer and the transducer drive amplifier. The control system determines the head velocity of the transducer from the input current and voltage and utilizes this determination in a feedback arrangement to maintain proper transducer excitation.

10 Claims, 12 Drawing Figures

$$E_0 = -E_i \left(\frac{R_2}{R_1}\right)$$

$$E_0 = -E_i \left(\frac{1}{sCR}\right)$$

$$E_0 = -E_i\ (sCR)$$

TRANSDUCER CONTROL SYSTEM

BACKGROUND OF THE INVENTION

1. Field of the Invention

The invention relates to transducer control systems, and particularly to a system for controlling the motional velocity of the radiating head of a longitudinal vibrator.

2. Description of the Prior Art

The successful steering of sonar beams from an array of transducers depends upon accurately knowing the mechanical velocity of the individual active acoustic radiation members. If the adjacent transducers of an array, be it a planar, conformal or other type of array are spaced less than one-half wavelength $$\left(\frac{\lambda}{2}\right)$$

then, due to mutual coupling effects between the transducers, the magnitude and phase of the radiation member velocity does not necessarily follow the magnitude and phase of the drive voltage, when operated at or near resonance. The effects of this mutual interaction may result in inaccuracies in beam location as well as non-prescribed side lobe levels.

The present invention corrects this situation by deriving a control signal which is proportional to the velocity of the radiation member, and without any physical attachment to the radiating member.

SUMMARY OF THE INVENTION

A transducer control circuit is connected between the transducer input leads and the transducer power source and is responsive to the transducer input current and voltage to generate a control signal which may be used in a feedback control circuit. In one typical electrical equivalent circuit analogy of the transducer, there is included a radiation load impedance which is subject to variation and an electrical circuit component representing the transducer's active acoustic radiation member. The control signal which is generated is proportional to the motional current through this electrical circuit component with the motional current being proportional to the velocity of the radiation member. In a preferred embodiment, the transducer is of the longitudinal vibrator or Tonpilz type having a head mass, a tail mass and a linear motor section therebetween.

DESCRIPTION OF THE PREFERRED EMBODIMENTS

Figure 1:
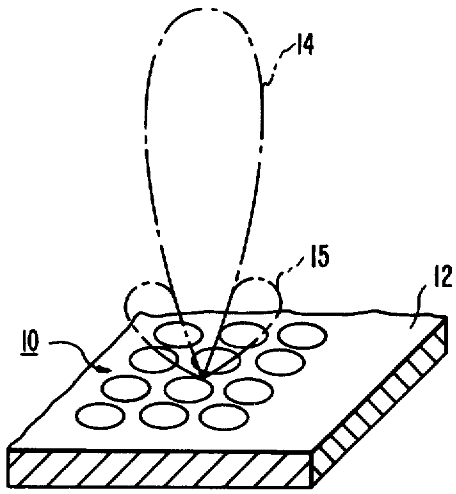
FIG. 1 illustrates an array of transducers with a formed beam.

FIG. 1 illustrates an array 10 of transducers within structure 12 with the transducers of the array collectively forming beam 14 having certain predetermined side lobes 15. The array in general may be planar, spherical, linear or may be conformal such as following the contours of a ship. The beam pattern is dependent upon the velocity distribution of the transmitting elements and in an ideal case a specific amplitude and phase velocity distribution exists in the array. In reality, however, each element of the array produces acoustic pressure at each other element of the array and accordingly the elements produce forces on each other so that the load that any element sees changes in accordance with that element's position in the array.

Figure 2:
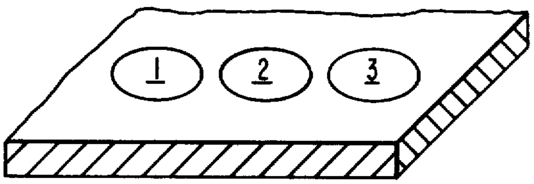
FIG. 2 illustrates three transducers of the array.

For example, in FIG. 2, there is illustrated three transducers of an array, more particularly, the active radiation members of transducers 1, 2 and 3. The force F exerted by member 1 is a function of its velocity U and its self-impedance Z. That is:

$$F_1 = U_1 Z_{11} \quad (1)$$

However, equation 1 is modified due to the interaction of units 2 and 3 such that in actuality:

$$F_1 = U_1 Z_{11} + U_2 Z_{12} + U_3 Z_{13} \quad (2)$$

where $U_2$ and $U_3$ are the forces due to members 2 and 3 and $Z_{12}$ and $Z_{13}$ are the mutual impedance between members 1 and 2 and 1 and 3 respectively. Similarly, for the other two units:

$$F_2 = U_2 Z_{22} + U_1 Z_{21} + U_3 Z_{23} \quad (3)$$

$$F_3 = U_3 Z_{33} + U_1 Z_{31} + U_2 Z_{32} \quad (4)$$

The total impedance (force F divided by velocity U) presented to member 1 for example is therefore:

$$\frac{F_1}{U_1} = Z_{11} + \frac{U_2}{U_1} Z_{12} + \frac{U_3}{U_1} Z_{13} \quad (5)$$

and it is seen that in operation the load impedance of an active member in an array is not a fixed unit ($Z_{11}$) but may vary due to interaction with other transducers of the array. A varying load impedance accordingly results in a non-uniform velocity distribution which may not only degrade proper operation, but in some cases, some transducers may even become sinks rather than sources in that they absorb acoustic energy which may result in damage to the transducer power amplifiers.

Figure 3:
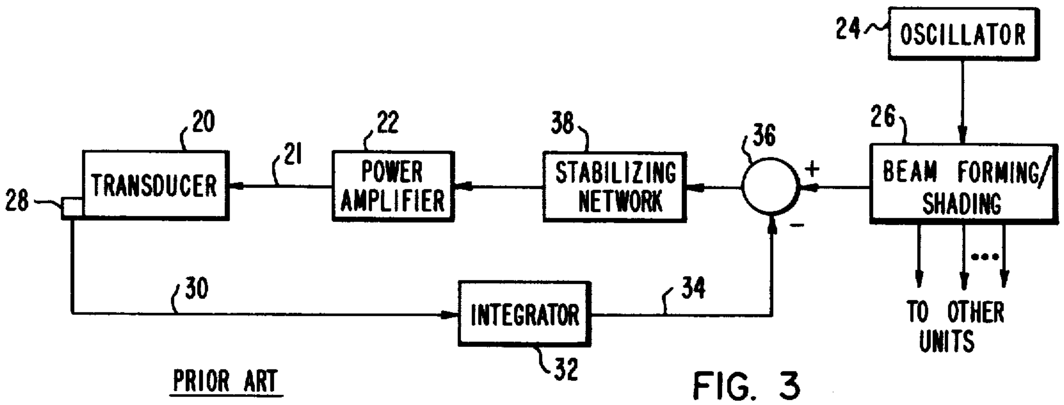
FIG. 3 is a block diagram illustrating a control arrangement of the prior art.

One prior art approach for maintaining accurate velocity control of the transducer active member is illustrated in FIG. 3. In the prior art arrangement, a transducer 20 is provided with an operating signal on line 21 from power amplifier 22. The signal is derived from a master oscillator 24 providing its output signal to a beam forming and/or shading network 26 which, in a well-known manner, modifies the oscillator signal in amplitude or phase or both for proper beam formation and steering.

In order to control the velocity of the active member of transducer 20, both in magnitude and phase, there is provided an accelerometer 28 mounted directly on the active member and which provides, on line 30, an output signal which is proportional to the acceleration of the active member. Since acceleration is the derivative of velocity, an integrator circuit 32 is responsive to the acceleration signal to provide, on line 34, a signal which is proportional to velocity.

In a well-known feedback circuit arrangement, the output of beam forming network 26 provided to subtractor 36 represents a reference input signal and the velocity signal on line 34 represents a controlled variable. The output of circuit 36 therefore represents the actuating error which, when properly amplified, drives the transducer to maintain proper velocity control in the presence of a varying load impedance. As is general in such feedback arrangements, a stabilizing network 38 is provided to prevent circuit oscillation and to maintain operation within a certain frequency range.

The arrangement of FIG. 3 has several drawbacks which must be examined. Initially, the provision of a plurality of accurately matched calibrated accelerometers for the transducers of the array represents a significant cost of the system. Further, if the transducer array is located in a relatively inaccessible location, labor costs and effort in replacing defective accelerometers or to backfit existing arrays with the accelerometer arrangement can be significant.

In cases where the transducer 20 is waterproofed in a separate housing from the power amplifier 22, multiple lines per transducer are necessary and can be troublesome. In addition, the transducer leads (in line 21) are supplied with signal levels of perhaps thousands of volts whereas the accelerometer output on line 30 is in the scale of millivolts and the problem of severe cross talk must be eliminated in some manner.

The need existed therefore, for a transducer control system which connects to the input side of the transducer and which will accurately provide an indication of radiating member velocity of not only new transducer arrays but which can be backfit into already existing, in-place arrays.

Figure 4:
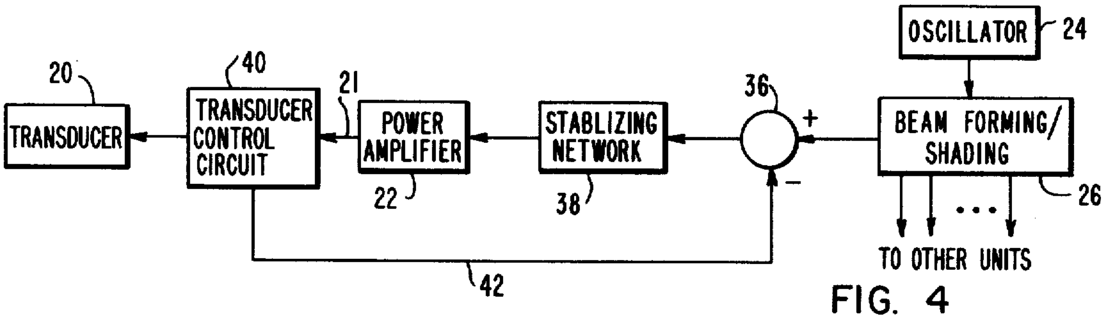
FIG. 4 is a block diagram illustrating the control arrangement of the present invention.

The present invention provides such a system as illustrated in block diagram form in FIG. 4, wherein components similar to FIG. 3 have been given like reference numerals. The transducer control circuit 40 of the present invention is interposed between transducer 20 and power amplifier 22 and is responsive to the input current and voltage to in turn provide an output control signal on line 42 which is utilized in the feedback arrangement to maintain proper velocity control of the radiating member of the transducer.

Although the control arrangement is applicable to a variety of transducer types, the present invention will be described with respect to the longitudinal vibrator such as the Tonpilz transducer illustrated in FIG. 5.

The transducer includes an active or motor section 50 made up of a plurality of electroded piezoceramic rings 51 interposed between a head mass or radiating head member 54 and a reaction mass or tail member 55. The motor section is electrically insulated from the head and tail members by means of insulating washers 58 and the assembly is held together by means of a stress rod 60 in conjunction with spring washer 62 and nut 63.

The transducer is housed in a support structure 65 (a portion being shown) and when operating in the transmit mode, a drive signal is applied to the action section 50 by means of leads 68 and 69. When the motor section 50 is electrically driven, there is a force (F) due to the acoustic radiation into the water at the head member 54. Although the same transducer may operate in the hydrophone, or receive mode of operation, such operation is not described herein.

In the field of dynamic analogies, mechanical or electromechanical systems such as a transducer can be represented entirely by an electrical equivalent circuit analogy with the electrical components representing the electrical or mechanical components of the system. This technology of analogy representation of transducers is extremely well known to those skilled in the art and one such system, which will be used herein, has the following correspondence:

| Mechanical Quantity (units) | Electrical Quantity (units) |
|---|---|
| force (Newtons) | voltage (volts) |
| velocity (meters per second) | current (amperes) |
| mass (kg) | inductance (Henrys) |
| compliance (meters per Newton) | capacitance (Farads) |
| mechanical impedance (ohms) | electrical impedance (ohms) |

Figure 5:
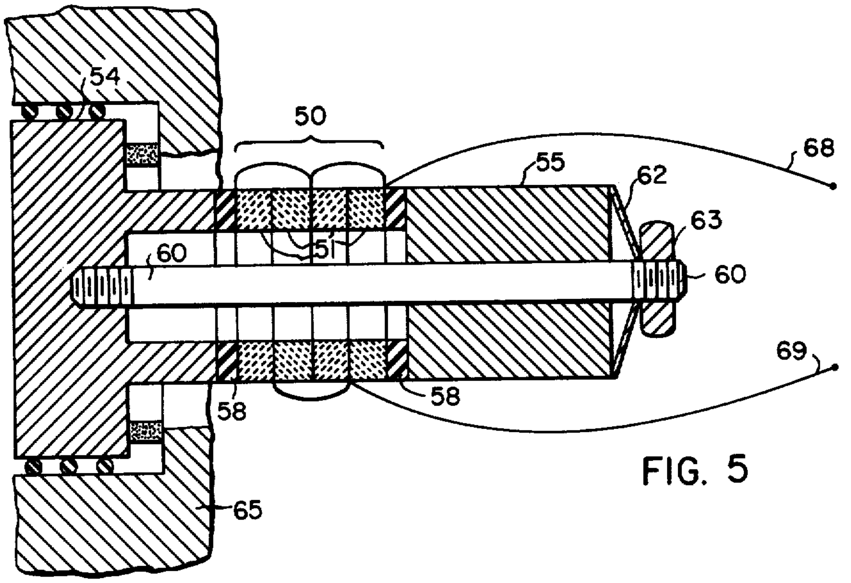
FIG. 5 is a cross-section of a Tonpilz transducer.
Figure 6:
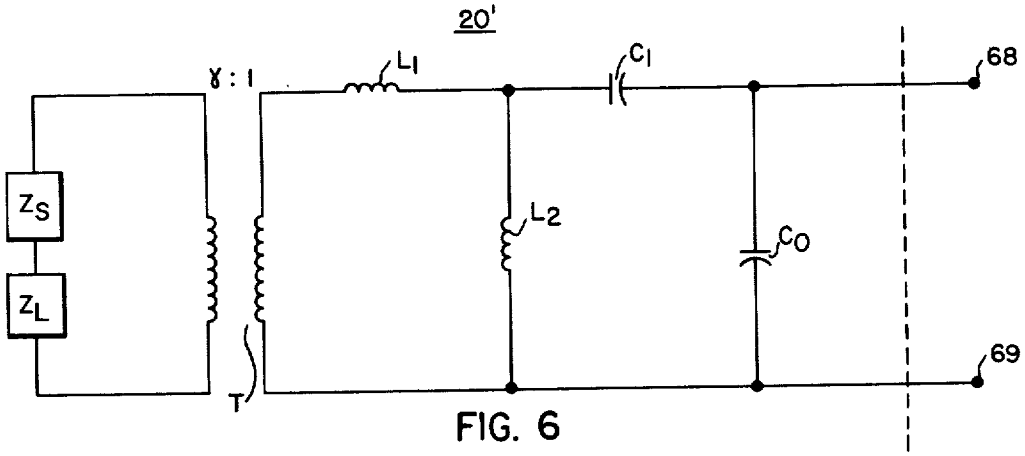
FIG. 6 is the electrical equivalent circuit of the transducer of FIG. 5.

In accordance with the dynamic analogy technology, the Tonpilz transducer of FIG. 5 may be represented by the electrical equivalent circuit 20' of FIG. 6, wherein leads 68 and 69 to the right of the vertical dotted line represent the actual leads of the transducer whereas the electrical components to the left of the dotted line represent the electric analogy.

Inductor $L_1$ represents the motional inductance of the head member and inductor $L_2$ in parallel circuit configuration therewith represents the motional inductance of the tail member. In series circuit configuration with the two inductors is capacitor $C_1$ representing the motional capacitance of the transducer and the clamped capacitance of the transducer is represented by capacitor $C_0$. Transformer T is known as an electromechanical transformer and has a transformer factor of $\gamma$: 1 measured in Newtons per volt. Load impedances $Z_S$ and $Z_L$ represent the mechanical impedance of the support and the radiation load impedance, respectively.

Figure 7:
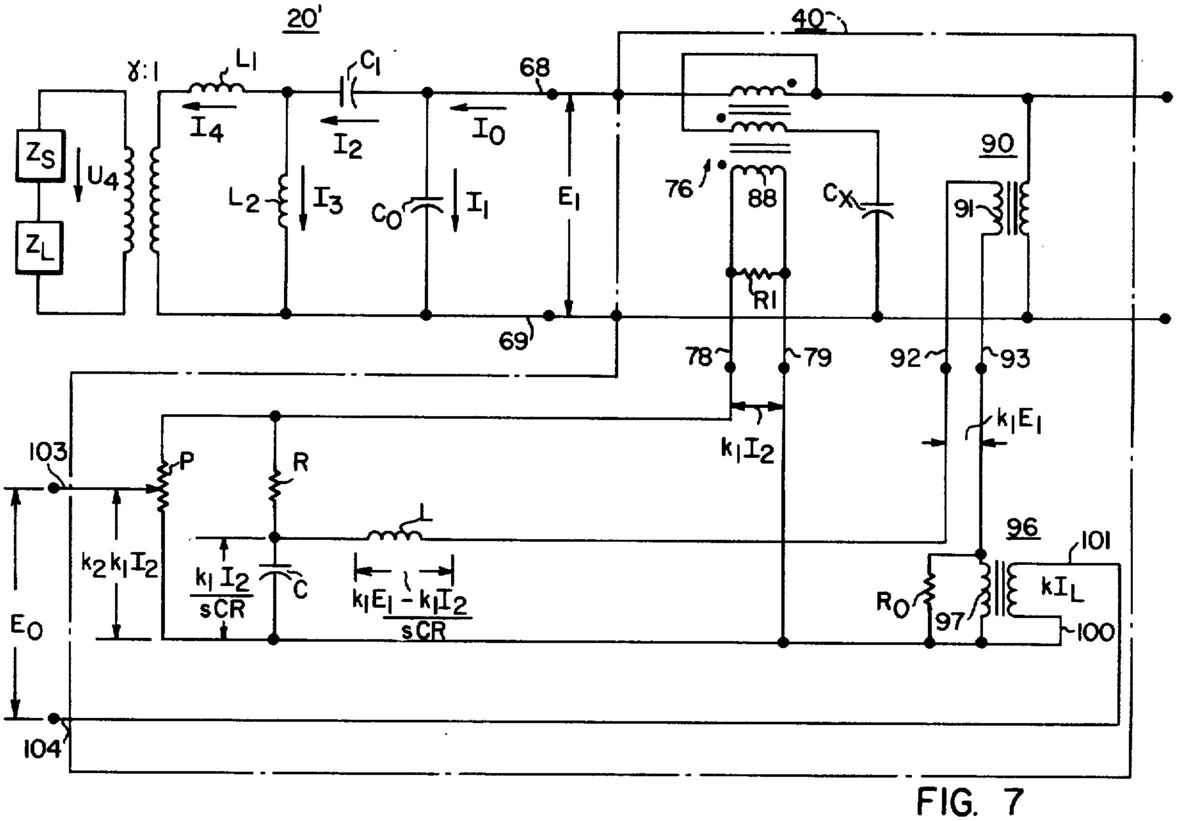
FIG. 7 is a circuit diagram illustrating one embodiment of the present invention.

FIG. 7 illustrates in more detail, the transducer 20' in conjunction with a passive embodiment of the transducer control circuit 40. Various currents are illustrated, as follows:

| | |
|---|---|
| $I_0$ | Current into transducer lead 68. |
| $I_1$ | Current through clamped capacitance $C_0$. |
| $I_2$ | Current through motional capacitance $C_1$. |
| $I_3$ | Current through motional inductance of tail $L_2$. |
| $I_4$ | Current through motional inductance of head $L_1$. |
| $U_4$ | Head velocity proportional (by $\gamma^2$) to $I_4$. |

In the control circuit 40, means are provided for obtaining a voltage proportional to the motional current through $L_1$, which voltage in turn is proportional to $U_4$, the head velocity. Included in the apparatus is a current transformer 76 which provides, across a resistor $R_1$, on output leads 78 and 79, a voltage proportional to $I_2$. This voltage, as well as other voltages proportional to certain quantities will be designated by that quantity with a proportion factor, thus, a voltage proportional to $I_2$ will be symbolized as $k_1I_2$. The derivation of $k_1I_2$ from the input current provided by the power amplifier may be explained with additional reference to FIG. 8.

Current into terminal 68 of the transducer is $I_0$, which is the current on line 82 through the core 84 of current transformer 76. A capacitor $C_x$ receives current from line 86 passing through core 84 in an opposite direction from current $I_0$. If $C_x$ is chosen to be equal to $C_0$, then, since the voltage across $C_0$ is the same as the voltage across $C_x$, the current through $C_x$ will be $I_1$. The result of $I_1$ passing through core 84 in an opposite direction from $I_0$ has the effect of subtracting $I_1$ from $I_0$. From FIG. 7:

$$I_0 - I_1 = I_2 \tag{6}$$

Sense winding 88 therefore provides a voltage proportional to the subtraction, that is $k_1I_2$.

Figure 8:
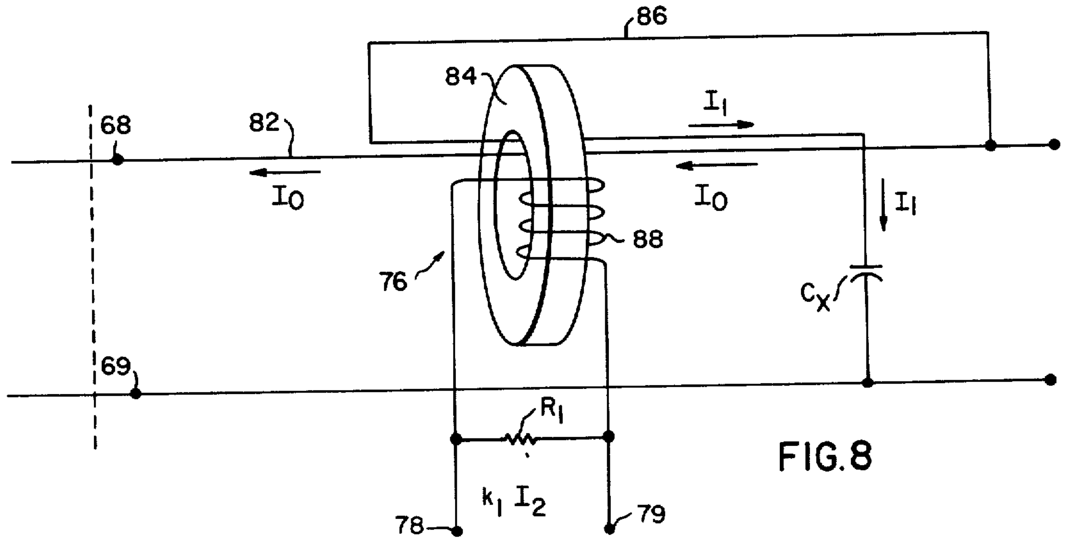
FIG. 8 illustrates a current sensor which may be utilized herein.

For ease of explanation, only a single loop back through core 84 by line 86 has been illustrated in FIG. 8. In actuality, the total ampere-turns in the reverse direction is equal to the total ampere-turns in the forward direction, and in a practical embodiment, there would be a plurality of turns in the reverse direction instead of one so as to lower the value of $C_x$. For example, if there were 10 turns, $C_x$ would be one-tenth $C_0$. A lower value of $C_x$ is desired since a smaller amount of power (volt-amps) will be drawn by $C_x$ from the power amplifier.

Referring once again to FIG. 7 and examining the current relationships, the current $I_4$ is equal to:

$$I_4 = I_2 - I_3 \tag{7}$$

The current $I_3$ is equal to the voltage across $L_2$ divided by its reactance, that is:

$$I_3 = \frac{E_{L2}}{sL_2} \tag{8}$$

where s is the Laplace operator equal to $j\omega$. The voltage across $L_2$ is equal to the voltage across leads 68–69 minus the voltage across $C_1$. That is:

$$E_{L2} = E_1 - \frac{I_2}{sC_1} \tag{9}$$

Since the motional current $I_4$ is $I_2$ minus $I_3$, then combining equations 7, 8 and 9:

$$I_4 = I_2 - \left[\frac{E_1 - \frac{I_2}{sC_1}}{sL_2}\right] \tag{10}$$

The passive control circuit 40 includes a number of physical components in a form of resistor R, capacitor C and inductor L. The voltage across the RC combination is the voltage across leads 78, 79, that is $k_1I_2$. The reactance of L is chosen to be much greater than the reactance of C and therefore the current I through the RC combination is substantially;

$$I = \frac{k_1I_2}{R + \frac{1}{sC}} \tag{11}$$

The voltage $E_c$ across C, is equal to the current through C times its reactance that is:

$$E_c = \frac{k_1I_2}{R + \frac{1}{sC}} \times \frac{1}{sC} = \frac{k_1I_2}{sCR + 1} \tag{12}$$

by making sCR >> 1 over the frequency range of interest, equation (12) reduces to:

$$E_c = \frac{k_1I_2}{sCR} \tag{13}$$

The control circuit includes means for obtaining a voltage proportional to the input voltage $E_1$. By way of example, this may be a voltage transformer 90 whose secondary winding provides the voltage $k_1E_1$ on leads 92, 93.

A current transformer 96 is connected to lead 93 and includes a low resistance $R_0$ in parallel with winding 97 and the voltage drop thereacross is negligible. Accordingly the voltage $E_L$ across L, is the difference between the voltage proportional to the input voltage and the voltage across capacitor C or:

$$E_L = k_1E_1 - \frac{k_1I_2}{sCR} \tag{14}$$

The current through L is euqal to the voltage across it divided by its reactance:

$$I_L = \frac{k_1E_1 - \frac{k_1I_2}{sCR}}{sL_4} \tag{15}$$

and the output of current transformer 96 at output leads 100, 101 is a voltage proportional to this current;

$$kI_L = k\left[\frac{k_1E_1 - \frac{k_1I_2}{sCR}}{sL_4}\right] \tag{16}$$

A voltage divider P is connected across the series combination of R and C and the voltage across the divider is $k_1I_2$. The voltage to tap 103, however, is proportional to the voltage across the divider and with the constant of proportionality being k2, the voltage is $k_2k_1I_2$.

The voltage from tap 103 to lead 104 is the output voltage $E_0$ and is equal to the voltage at tap 103 minus the output voltage of the current transforming 96, that is:

$$E_0 = k_1k_2I_2 - k\left[\frac{k_1E_1 - \frac{k_1I_2}{sCR}}{sL_4}\right] \tag{17}$$

by making $$\frac{k}{L_4} = \frac{k_2}{L_2}$$

equation (17) with factoring reduces to:

$$E_0 = k_1k_2\left[ I_2 - \frac{\left(E_1 - \frac{I_2}{sCR}\right)}{sL_2} \right] \quad (18)$$

by making the magnitude of CR equal to the magnitude of $C_1$:

$$E_0 = k_1k_2\left[ I_2 - \frac{\left(E_1 - \frac{I_2}{sC_1}\right)}{sL_2} \right] \quad (19)$$

The term in brackets of equation 19 is identical with the definition of $I_4$ in equation 10 and accordingly, the magnitude and phase of output voltage $E_0$ of the transducer control circuit 40 is proportional to the magnitude and phase of $I_4$ and accordingly is proportional to the magnitude and phase of the head velocity.

Figure 9A:
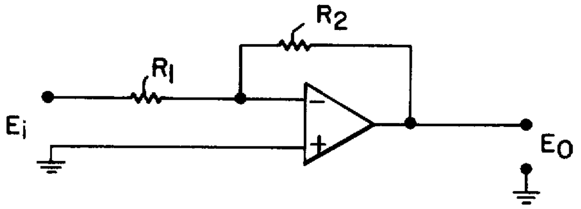
FIGS. 9A to 9C are illustrative of several operational amplifiers.
Figure 9B:
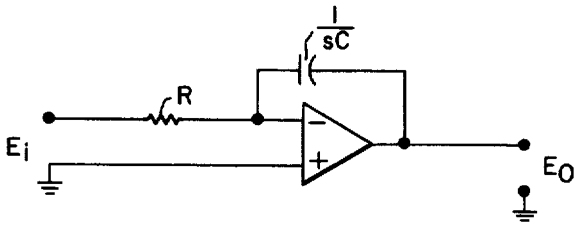
Figure 9C:
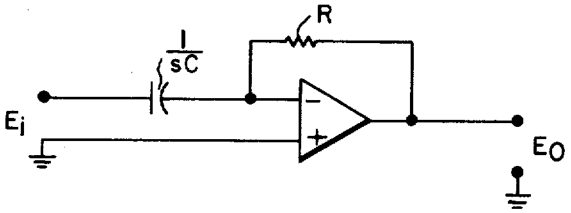

The transducer control circuit of FIG. 7 is a relatively inexpensive device requiring passive components in the form of voltage and current transformers, a capacitor, an inductor, and several resistor elements. A control circuit utilizing active elements may be fabricated, the active elements being in the form of operational amplifiers such as illustrated in FIGS. 9A to 9C. Each of the examples includes an amplifier having an input voltage $E_i$ and an output voltage $E_0$ with an input impedance and a feedback impedance. In each example, the output voltage is equal to the negative of the input voltage times the ratio of the feedback impedance to the input impedance, as illustrated.

Figure 10:
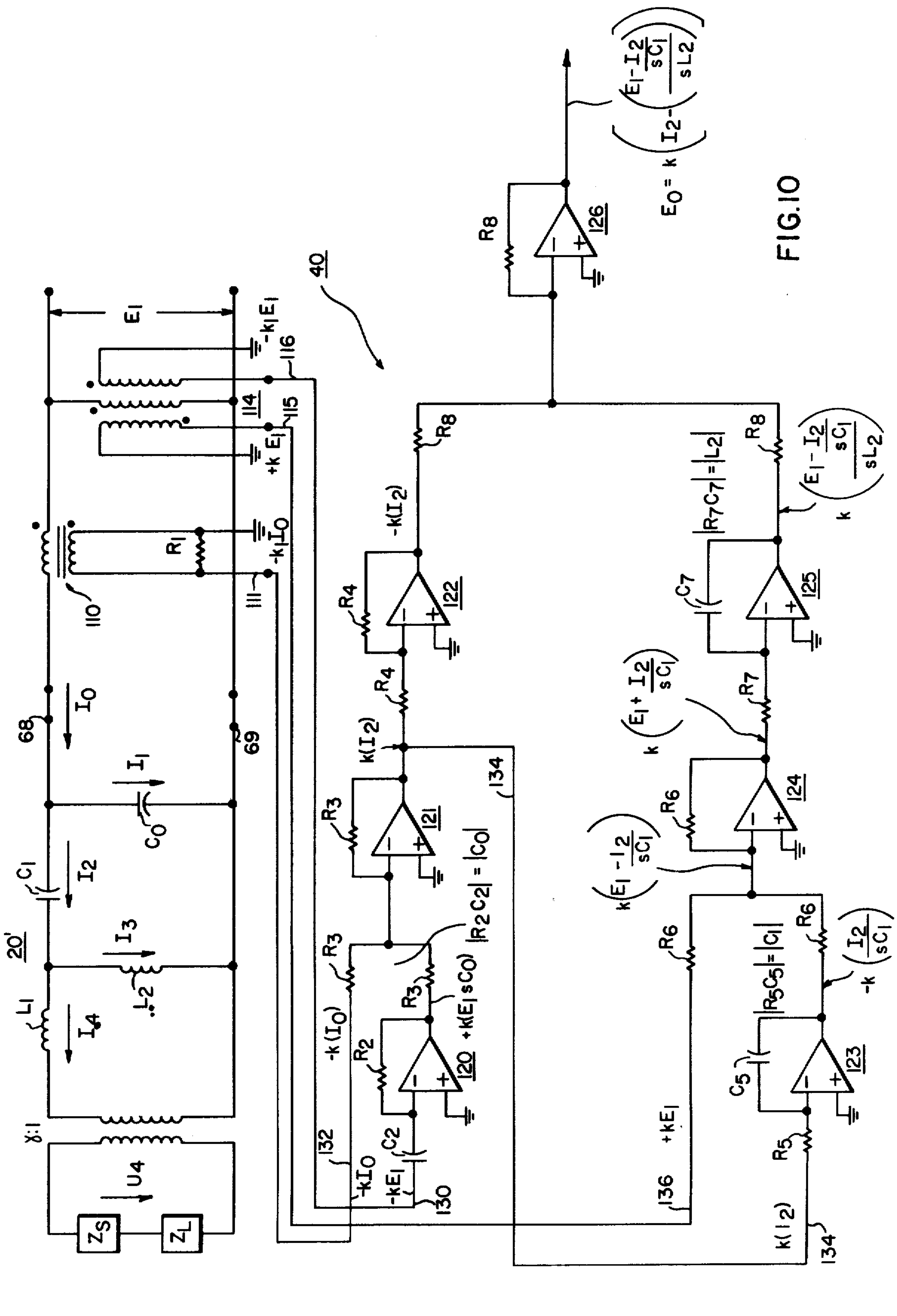
FIG. 10 illustrates another embodiment of the present invention utilizing the operational amplifiers of FIGS. 9A through 9C.

A transducer control network 40 utilizing the active components of FIGS. 9A to 9C, is illustrated in FIG. 10. Means are provided for obtaining signals proportional to the input current and input voltage. Thus, current transformer 110 provides an output voltage $-kI_0$ on output lead 111 relative to ground. A voltage transformer 114 provides two output signals, one, a voltage $+kE_1$ on output lead 115 relative to ground and the other $-kE_1$ on output lead 116 relative to ground.

The control circuit includes a plurality of operational amplifiers 120 to 126 with operational amplifier 120 being the same as that illustrated in FIG. 9C, operational amplifiers 123 and 125 being the same as that illustrated in FIG. 9B, operational amplifier 122 being the same as that illustrated in FIG. 9A, and the remaining three operational amplifiers 121, 124, and 126 being unity gain summers.

In operation, the signal $-kE_1$ is applied, on line 130, to operational amplifier 120. By choosing the magnitude of $R_2C_2$ equal to the magnitude of $C_0$ the output of operational amplifier is $k(E_1sC_0)$. This is added with $-kI_0$ on line 132, and applied through high impedance isolation resistors $R_3$ to unity gain amplifier 121, the output of which is $kI_2$. (The input current $I_0$ minus $E_1sC_0$ which is the current through capacitor $C_0$).

With the input and feedback resistors $R_4$ of operational amplifier 122 being equal, the output thereof will be $-kI_2$. $kI_2$ in addition to being provided to operational amplifier 122 is also provided, on line 134, to operational amplifier 123 which, with the magnitude of $R_5C_5$ equal to the magnitude $C_1$ will provide an output $$\frac{-kI_2}{sC_1}.$$

This signal is combined with $kE_1$ on line 136 such that unity gain summer 124 provides an output signal $$k\left(-E_1 + \frac{I_2}{sC_1}\right).$$

By choosing the magnitude of $R_7C_7$ equal to the magnitude of $L_2$, the output of operational amplifier 125 will be $$k\left(\frac{E_1 - \frac{I_2}{sC_1}}{sL_2}\right).$$

The signals from operational amplifiers 122 and 125 are provided through high impedance isolation resistors $R_8$ to unity gain summer 126, the output of which therefore is $$E_0 = k\left[ I_2 - \frac{\left(E_1 - \frac{I_2}{sC_1}\right)}{sL_2} \right].$$

which is of the form illustrated in equation 19 and which is proportional to the magnitude and phase of velocity of the head member.

Thus, there has been described apparatus for deriving a signal which is proportional to the amplitude and phase of the transducer radiating head velocity and which is employed in conjunction with a feedback arrangement to derive an error correcting voltage to drive the transducer. In operation, the head velocity will closely be proportional to the input reference signal in amplitude and phase and will be independent of the mechanical load impedance on the head.

Although the invention has been described with respect to a Tonpilz transducer of an array, it can be used with other types of longitudinal resonators and in simpler form can be used for velocity control of spheres, closed cylinders, bender discs and various other types of transducers. The control circuit is also useful in industrial applications where great variations in load may occur, such as in ultrasonic cutting and cleaning operations, to prevent transducer damage or destruction.

We claim:

1. A transducer control circuit for connection between a transducer and a transducer power source, said transducer having input leads, and an active acoustic radiation member subject to varying loading and a reaction member, comprising:

(a) means connected to said transducer input leads for obtaining signals indicative of the input current and voltage of said transducer; and (b) circuit means responsive to said current and voltage indicative signals for generating a control signal proportional to the velocity of said radiation member.

2. A transducer control circuit for connection between a transducer and a transducer power source, said transducer having input leads, an active acoustic radiation member subject to varying loading a reaction member and an electrical equivalent circuit analogy which includes an electrical circuit component representative of said radiation member, comprising:

(a) means connected to said transducer input leads for obtaining signals indicative of the input current and voltage of said transducer; and (b) circuit means responsive to said current and voltage indicative signals for generating a control signal proportional to the motional current through said electrical circuit component of said electrical equivalent circuit analogy, said motional current being proportional to the velocity of said radiation member.

3. Apparatus according to claim 2 wherein said electrical equivalent circuit includes a clamped capacitance ($C_0$) across said leads and which includes:

(a) a current transformer having a core;

(b) a capacitor ($C_x$) connected across the input line to said transducer;

(c) a first lead supplying current to said transducer and arranged to pass said current through said core in a first direction;

(d) a second lead supplying current to said capacitor ($C_x$) and arranged to pass said current through said core in an opposite direction relative to the current in said first lead; and (e) an output winding coupled to said core to provide an output signal proportional to the difference in currents passing through said core in opposite directions.

4. Apparatus according to claim 3 wherein:

(a) the total ampere-turns through said core in said first direction is equal to the total ampereturns through said core in said opposite direction.

5. Apparatus according to claim 2 which includes:

(a) a power amplifier connected to said input leads;

(b) a source of drive signal; and (c) means for subtracting said control signal from said drive signal and applying the resulting signal to said power amplifier.

6. Apparatus according to claim 2 wherein:

(a) said transducer is a longitudinal vibrator and includes a head member, a tail member and a linear motor section; and (b) the electrical equivalent circuit of said transducer includes a radiation load impedance, a first inductor ($L_1$) representing the motional inductance of said head member and operatively connected to said load impedance, a second inductor ($L_2$) in parallel circuit configuration with said first inductor and representing the motional inductance of said tail member, a first capacitor ($C_1$) in series circuit configuration with said parallel inductors and representing the transducer motional capacitance and a second capacitor ($C_0$) across said input leads and representing the clamped capacitance of said transducer.

7. Apparatus according to claim 6 which includes:

(a) a resistor (R) and capacitor (C) in series;

(b) a voltage divider (P) in parallel with the series arrangement of said resistor and capacitor;

(c) means for applying said input current indicative signal to the parallel arrangement of RC and P;

(d) an inductor (L) having one end connected to receive said input voltage indicative signal and having its other end connected to the junction between said resistor and capacitor;

(e) a current transformer for sensing the current in said inductor and operable to provide an output signal indicative thereof;

(f) output means connected to a point on said voltage divider and to said current transformer to provide an output signal ($E_0$); and (g) said point being chosen and the values of said resistor, capacitor and inductor being chosen such that said output signal $E_0$ is equal to:

$$E_0 = k_1 k_2 \left[ I_2 - \frac{\left( E_1 - \frac{I_2}{sC_1} \right)}{sL_2} \right]$$

where $k_1$ and $k_2$ are constants of proportionality;

$I_2$ is the current through $C_1$;

$E_1$ is the transducer input voltage at leads 68, 69;

$sC_1$ is the reactance of $C_1$;

$sL_2$ is the reactance of $L_2$.

8. Apparatus according to claim 7 which includes:

(a) a current transformer connected to an input lead of said transducer for deriving said current indicative signal; and (b) a voltage transformer connected to said input leads for deriving said voltage indicative signal.

9. A transducer control circuit for connection between a transducer and a transducer power source, said transducer having input leads, an active acoustic radiation member subject to varying loading a reaction member and an electrical equivalent circuit analogy which includes an electrical circuit component representative of said radiation member, comprising:

(a) first means for obtaining a signal proportional to the input current of said transducer;

(b) second means for obtaining positive and negative signals proportional to the input voltage of said transducer; and (c) active circuit means responsive to all said signals for generating a control signal proportional to the motional current through said electrical circuit component of said electrical equivalent circuit analogy, said motional current being proportional to the velocity of said radiation member.

10. Apparatus according to claim 9 wherein:

(a) said active circuit means includes a plurality of operational amplifiers.

* * * * *